United States Patent
Dennison et al.

[11] Patent Number: 6,037,218
[45] Date of Patent: *Mar. 14, 2000

[54] SEMICONDUCTOR PROCESSING METHODS OF FORMING STACKED CAPACITORS

[75] Inventors: Charles H. Dennison; Michael A. Walker, both of Boise, Id.

[73] Assignee: Micron Technology, Inc., Boise, Id.

[*] Notice: This patent is subject to a terminal disclaimer.

[21] Appl. No.: 08/870,786

[22] Filed: Jun. 6, 1997

Related U.S. Application Data

[63] Continuation of application No. 08/560,897, Nov. 20, 1995, Pat. No. 5,652,164, which is a continuation of application No. 08/237,371, Apr. 29, 1994, Pat. No. 5,498,562, which is a continuation of application No. 08/044,824, Apr. 7, 1993, abandoned.

[51] Int. Cl.[7] ............................................. H01L 21/8242
[52] U.S. Cl. .............................................................. 438/254
[58] Field of Search ................................... 438/253–256, 438/390–399

[56] References Cited

U.S. PATENT DOCUMENTS

| | | | |
|---|---|---|---|
| 4,364,167 | 12/1982 | Donley | 437/235 |
| 4,686,000 | 8/1987 | Heath | 437/235 |
| 4,855,801 | 8/1989 | Kuesters | 357/23.6 |
| 4,948,743 | 8/1990 | Ozaki | 437/235 |
| 4,965,221 | 10/1990 | Dennison et al. | 437/70 |
| 5,005,072 | 4/1991 | Gonzalez | 357/23.6 |
| 5,006,484 | 4/1991 | Harada | 437/235 |
| 5,010,039 | 4/1991 | Ku et al. | 437/228 |
| 5,043,298 | 8/1991 | Yamada et al. | 437/52 |
| 5,049,517 | 9/1991 | Liu et al. | 437/52 |
| 5,061,650 | 10/1991 | Dennison et al. | 437/47 |
| 5,063,176 | 11/1991 | Lee et al. | 437/195 |
| 5,135,883 | 8/1992 | Bae et al. | 437/52 |
| 5,174,858 | 12/1992 | Yammumoto et al. | 437/52 |
| 5,185,282 | 2/1993 | Lee et al. | 437/52 |
| 5,229,314 | 7/1993 | Okudaira et al. | 437/52 |
| 5,238,862 | 8/1993 | Blalock et al. | 437/52 |

FOREIGN PATENT DOCUMENTS

| | | | |
|---|---|---|---|
| 022295 | 12/1984 | Japan | 437/982 |
| 63-133565 | of 1986 | Japan | . |
| 1-100960 | of 1989 | Japan | . |
| 1-215060 | of 1989 | Japan | . |
| 0260453 | of 1990 | Japan | . |

OTHER PUBLICATIONS

Watanabe et al., "A New Stacked Capacitor Structure Using Hemispherical–Grain (HSG) Poly–Silicon Electrodes," Extended Abstracts of the 22nd (1990 International) Conference on Solid State Devices and Materials, Sendai, 1990, pp. 873–876.

T. Mine et al., "Capacitance–Enhanced Stacked–Capacitor with Engraved Storage Electrode for Deep Submicron DRAMs," Extended Abstracts of the 21st Conference on Solid State Devices and Materials, 1989, pp. 137–140.

(List continued on next page.)

*Primary Examiner*—Jey Tsai
*Attorney, Agent, or Firm*—Wells, St. John, Roberts, Gregory & Matkin P.S.

[57] ABSTRACT

In one aspect of the invention, an insulative nitride oxidation barrier layer is provided over a cell polysilicon layer to a thickness of at least about 150 Angstroms. An insulating layer is provided above the nitride oxidation barrier layer, and an contact/container is etched therethrough and through dielectric and cell polysilicon layers. Such exposes edges of the cell polysilicon within the contact/container. The wafer is then exposed to an oxidizing ambient to oxidize the cell polysilicon exposed edges, with the nitride oxidation barrier layer during such oxidation exposure inhibiting oxidation of the outer surface of the cell polysilicon layer. In another aspect, a multi-container stacked capacitor construction has its containers defined or otherwise electrically isolated in a single CMP step. In another aspect, a combination etch stop/oxidation barrier layer or region is provided to enable exposure of a precise quantity of the outside walls of a stacked capacitor container.

12 Claims, 14 Drawing Sheets

OTHER PUBLICATIONS

S. Inoue, et al., "A Spread Stacked Capacitor (SSC) Cell for 64 MBIT DRAMs," IEDM Tech. Dig., pp. 31–34 (1989).

T. Ema et al., "3–Dimensional Stacked Capacitor Cell for 16M and 64M DRAMs," IEDM Tech. Dig., pp. 592–595 (1988).

K.H. Kusters et al., "A Stacked Capacitor Cell with a Fully Self–Aligned Contact Process for High–Density Dynamic Random Access Memories," Electrochem. Soc., vol. 139, No. 8, Aug. 1992, p. 2318.

Paul Riley, et al., "Formation of Contacts in a Planarized $SiO_2/Si_3N_4/SiO_2$ Dielectric Structure," J. Electrochem. Soc., vol. 139, No. 9, Sep. 1992, pp. 2613–2616.

H. Itoh, et al., "Two Step Deposited Rugged Surface (TDRS) Storage–Node and Self–Aligned Bitline–Contact Penetrating Cellplate (SABPEC) for 64MbDRAM STC Cell," Unknown publishing date and publisher.

D. Temmler, "Multilayer Vertical Stacked Capacitors (MVSTC) for 64Mbit and 256Mbit DRAMs," pp. 13–14, Unknown publishing date and publisher.

T. Ozaki et al., "A Fence Stacked Capacitor (FSC) Cell for 256Mbit DRAMs," ULSI Research Center, Unknown publishing date and publisher.

"Stacked Capacitor DRAM Cell with Vertical Fins (VF–STC)," IBM Technical Disclosure Bulletin, vol. 33, No. 2, Jul. 1990, pp. 245–246.

Y. Hayashide, et al., "Fabrication of Storage Capacitance–Enhanced Capacitors with a Rough Electrode," Extended Abstract of the 22nd Conference SSMD, (1990), pp. 869–872.

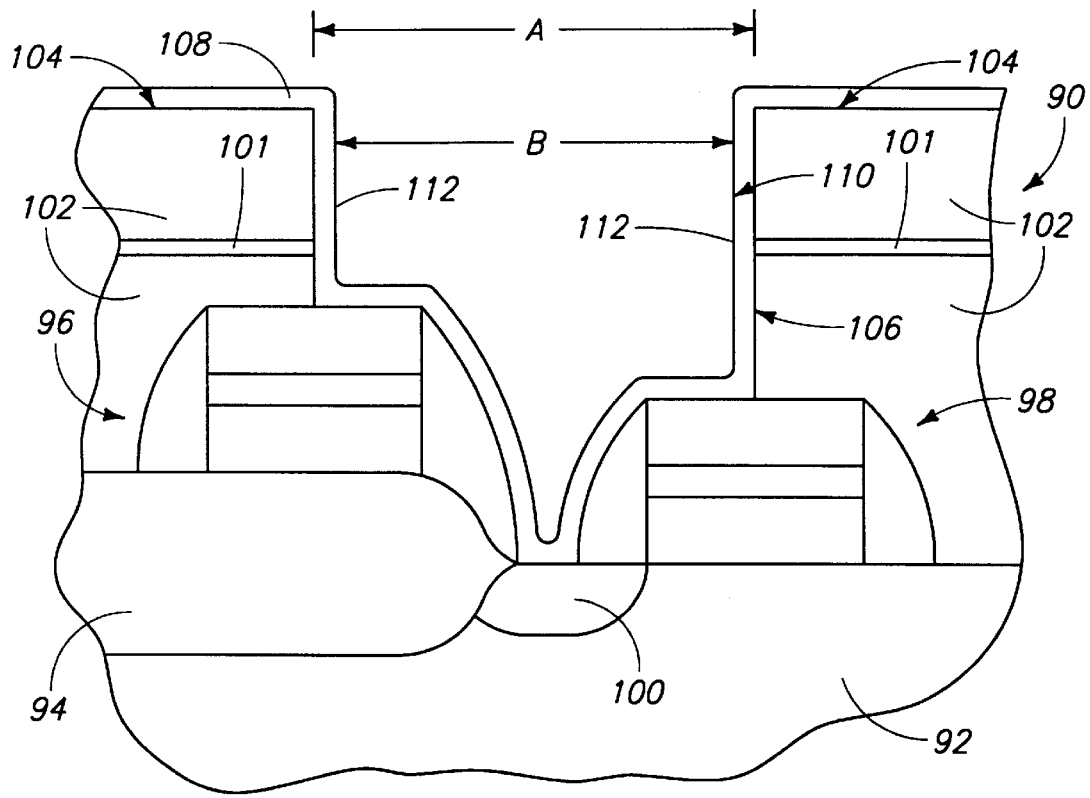
_Fig. 10_
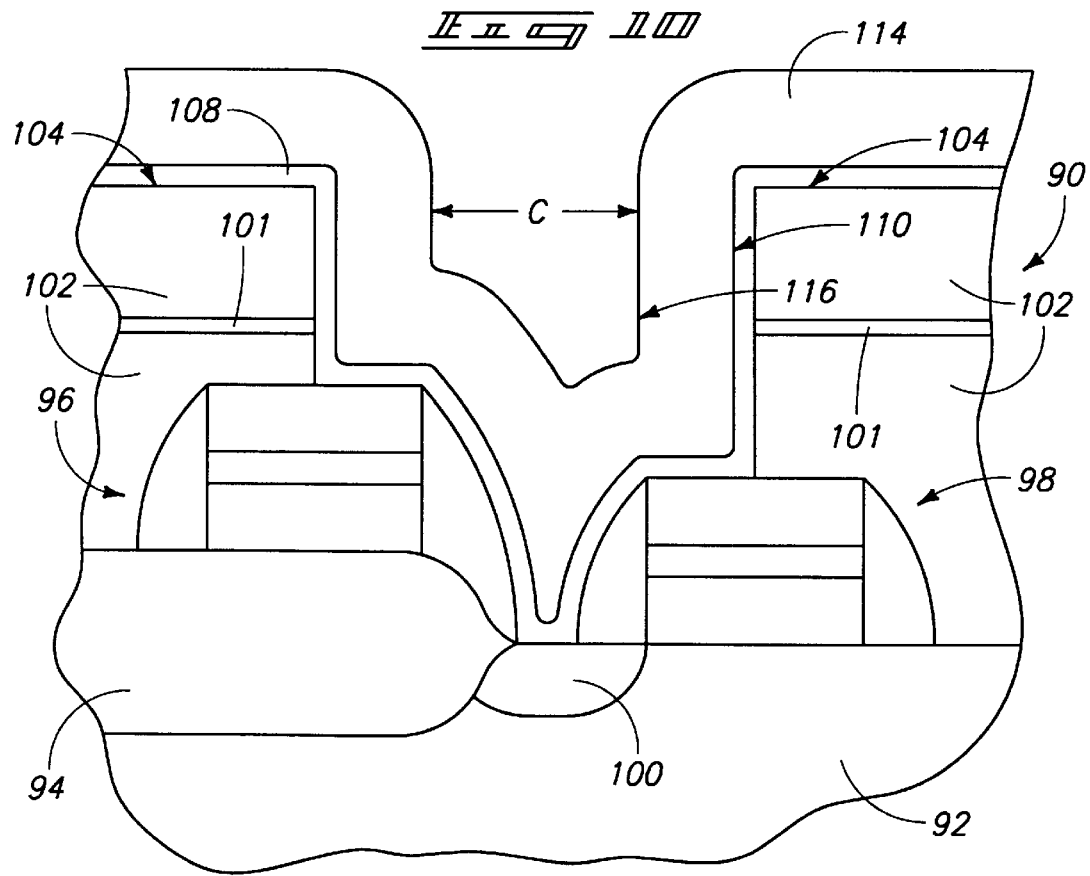
_Fig. 11_

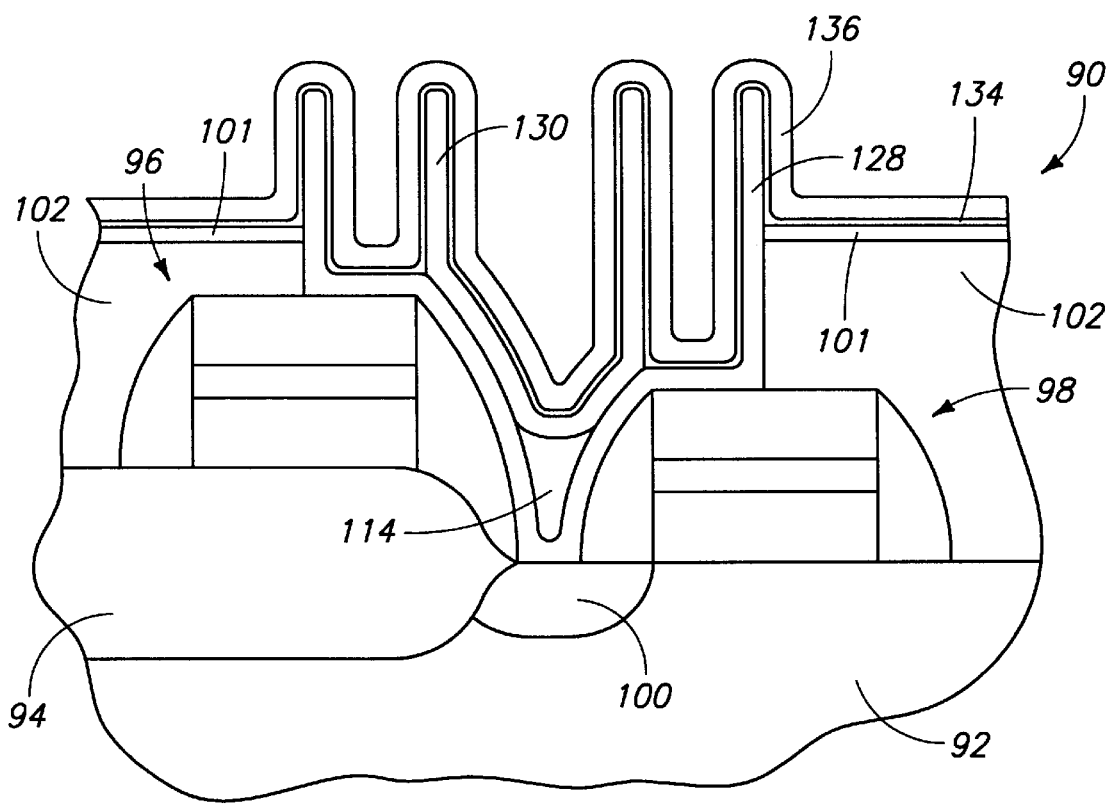
_Fig 16_

SEMICONDUCTOR PROCESSING METHODS OF FORMING STACKED CAPACITORS

RELATED PATENT DATA

This patent stems from a continuation application of U.S. patent application Ser. No. 08/560,897, filed Nov. 20, 1995, by Charles H. Dennison and Michael A. Walker, and entitled "Semiconductor Processing Methods of Forming Stacked Capacitors", now U.S. Pat. No. 5,652,164, which is itself a continuation application of U.S. patent application Ser. No. 08/237,371, filed Apr. 29, 1994, by Charles H. Dennison and Michael A. Walker, and entitled "Semiconductor Processing Methods of Forming Stacked Capacitors", now U.S. Pat. No. 5,498,562, issued Mar. 12, 1996. U.S. Pat. No. 5,498,562 was a continuation application of U.S. patent application Ser. No. 08/044,824, filed Apr. 7, 1993, by Charles H. Dennison and Michael A. Walker, and entitled "Semiconductor Processing Methods of Forming Stacked Capacitors", which is now abandoned.

TECHNICAL FIELD

This invention relates generally to capacitor formation in semiconductor wafer processing, and to formation of memory cells employing capacitors.

BACKGROUND OF THE INVENTION

As DRAMs increase in memory cell density, there is a continuous challenge to maintain sufficiently high storage capacitance despite decreasing cell area. Additionally, there is a continuing goal to further decrease cell area.

The principal way of increasing cell capacitance is to through cell structure techniques. Such techniques include three-dimensional cell capacitors, such as trenched or stacked capacitors. This invention concerns stacked capacitor cell constructions, including what are commonly known as crown or cylindrical container stacked capacitors, as well as to other stacked capacitor constructions. Aspects of the invention will have specific application in 64 Meg process flows and beyond.

BRIEF DESCRIPTION OF THE DRAWINGS

Preferred embodiments of the invention are described below with reference to the following accompanying drawings.

FIG. 10 is a diagrammatic sectional view of an alternate semiconductor wafer processed in accordance with the invention.

FIG. 11 is a sectional view of the FIG. 10 wafer at a processing step subsequent to that shown by FIG. 10.

FIG. 16 is a sectional view of the FIG. 10 wafer at a processing step subsequent to that shown by FIG. 15.

DETAILED DESCRIPTION OF THE PREFERRED EMBODIMENTS

Figure 1:
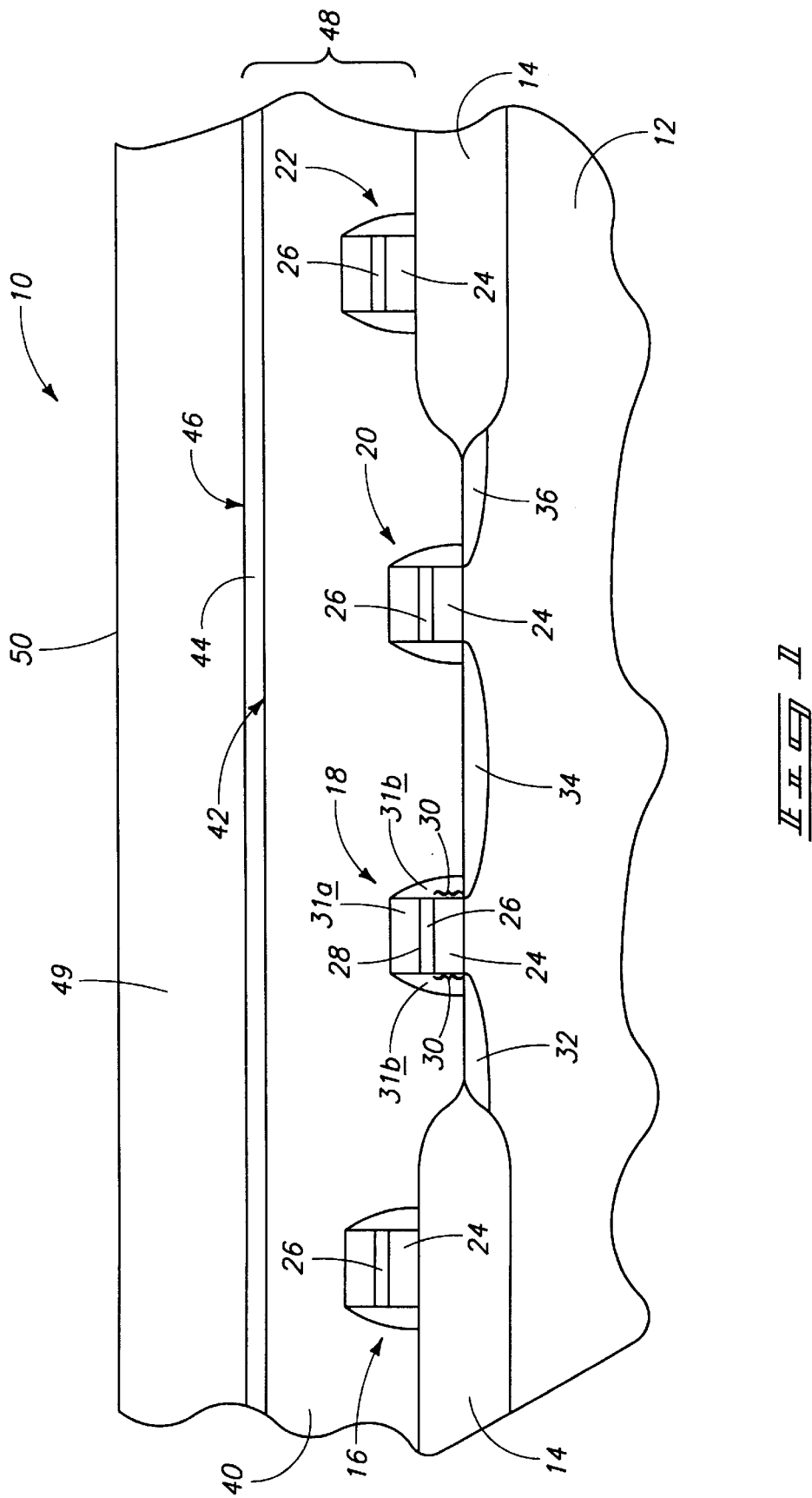
FIG. 1 is a diagrammatic sectional view of a semiconductor wafer processed in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a stacked container capacitor on a semiconductor wafer comprises the following steps:

providing an insulating layer and first contact/container opening therewithin, the insulating layer having an upper surface, the first contact/container opening having a first open width at the upper surface, the first contact/container opening exposing an area to which electrical connection is to be made;

providing a first layer of conductive material above the insulating layer and within the first contact/container opening over the area to which electrical connection is to be made, the first layer being provided to a thickness which is less than one half the first open width leaving a second outward opening having a second open width between conductive material inner sidewalls which is less than the first open width;

providing sacrificial spacers within the second outward opening inwardly adjacent the conductive material inner sidewalls, the sacrificial spacers having a combined width which is less than the second open width leaving a third outward opening having a third open width which is less than the second open width;

providing a second layer of conductive material above the first layer of conductive material and within the third outward opening and over the sacrificial spacers, the second layer of conductive material electrically connecting with the first layer of conductive material within the third outward opening;

chemical-mechanical polishing the second and first conductive layers to the insulating layer upper surface in a single step to define an isolated capacitor storage node container having sidewalls electrically interconnected with an inner upwardly projecting conductive mass;

after chemical-mechanical polishing, etching the sacrificial spacers away from the wafer to provide lateral space between the upwardly projecting conductive mass and sidewalls;

after etching the sacrificial spacers away, providing a capacitor dielectric layer over the isolated capacitor storage node; and providing a conductive capacitor cell layer over the capacitor dielectric layer.

In accordance with another aspect of the invention, a semiconductor processing method of forming a memory cell having a stacked container capacitor on a semiconductor wafer comprises the following steps:

providing a field effect transistor gate and a pair of adjacent source/drain areas, the transistor gate having electrically insulated sidewalls and an electrically insulated top;

providing a planarized base layer of insulating material atop the wafer over the transistor gate and source/drain areas, the planarized base layer having a planar uppermost region and a planar uppermost surface, the planar uppermost surface being elevationally above the electrically insulated transistor top;

providing an intermediate layer of insulating material atop the uppermost region of the planarized base layer, the insulating material of the intermediate layer being different in composition from the insulating material of the uppermost region of the base layer with the insulating material of the intermediate layer being selectively etchable relative to the insulating material of such uppermost region;

etching a capacitor contact/container opening through the intermediate and base layers of insulating material to one of the source/drain areas, the capacitor contact/container opening having a first open width;

providing a first layer of conductive material above the intermediate layer and within the first contact/container opening over the one source/drain area, the first layer of conductive material being provided to a thickness which is less than one half the first open width leaving a second outward opening having a second open width which is less than the first open width, the first layer of conductive material being selected such that the intermediate layer of insulating material is selectively etchable relative to the first layer of conductive material;

removing the first layer of conductive material from above the intermediate insulating layer to define an isolated capacitor storage node container, the isolated capacitor storage node having sidewalls having inner surfaces and outer surfaces;

etching the intermediate insulating layer selectively relative to the isolated capacitor storage node and uppermost region of the base layer, and using the uppermost region of the base layer as an etch stop during such etching to expose only a portion of the outer surfaces of the isolated capacitor storage node sidewalls;

providing a capacitor dielectric layer over exposed inner and outer sidewall surfaces of the isolated capacitor storage node; and providing a conductive capacitor cell layer over the capacitor dielectric layer.

In accordance with yet another aspect of the invention, a semiconductor processing method of forming a capacitor on a semiconductor wafer comprises the following steps:

providing an area on a semiconductor wafer to which a capacitor plate is to be connected;

providing a conductive storage node layer atop the wafer over the area;

providing a dielectric layer over the storage node layer;

providing a cell polysilicon layer over the dielectric layer, the cell polysilicon layer having an outer surface;

providing an electrically insulative nitride oxidation barrier layer over the cell polysilicon layer to a thickness of at least about 150 Angstroms;

providing an insulating layer above the nitride oxidation barrier layer;

etching a contact/container opening through the insulating layer, nitride layer and cell polysilicon layer, the contact/container opening having sidewalls, the contact/container opening sidewalls including an exposed edge of the cell polysilicon layer; and exposing the wafer having the contact/container opening to an oxidizing ambient to oxidize the cell polysilicon exposed edge, the nitride oxidation barrier layer during such oxidation exposure inhibiting oxidation of the outer surface of the cell polysilicon layer.

This invention includes improvements upon our co-pending U.S. patent application Ser. No. 07/947,523, filed on Sep. 18, 1992, and entitled "Reduced Mask CMOS Process For Fabricating Stacked Capacitor Multimegabit Dynamic Random Access Memories. Utilizing Single Etch Stop Layer for Contact/containers", which is hereby incorporated by reference.

More particularly, and first with reference to FIGS. 1–9, a semiconductor wafer fragment is indicated generally by reference numeral 10. Wafer 10 is comprised of a bulk substrate 12 and field oxide regions 14. A series of four word lines 16, 18, 20 and 22 are provided, being comprised of polysilicon regions 24 and $WSi_x$ regions 26. The discussion focuses on word line 18, with the remaining word lines having similar constructions. The conductive portions of word line 18 include a top 28 and sidewalls 30. Such are electrically insulated by covering layers of a first insulating material 31A and 31B, which in the preferred embodiment comprise $Si_3N_4$. Such would be provided in separate steps and could of course be comprised of different materials. A pair of source/drain areas 32, 34 lie adjacent word line 18. A source/drain area 36 is also shown with respect to word line 20, with source/drain region 34 serving as a common active area for both word lines 18 and 20. Word line 18 in operation define a field effect transistor gate for a transistor of a memory cell. Capacitors will be provided and electrically connect with source/drain areas 32 and 36. Thus, region 32 defines an area on a semiconductor wafer to which a capacitor plate is to be connected. A bit line will connect with region 34, as will be apparent from the continuing discussion.

A planarized underlying layer 40 of insulating material is provided atop the wafer over the word line and source/drain areas to provide an upper surface 42 which is elevationally above insulating material 31 and correspondingly word line top 28. Surface 42 is preferably from about 500 Angstroms to about 2000 Angstroms above the upper surface of the uppermost insulating region 31. Underlying layer 40 is preferably an oxide of the $SiO_2$ variety, such as phosphosilicate glass (PSG) or borophosphosilicate glass (BPSG), with BPSG being preferred.

A combination etch stop and oxidation barrier insulative layer 44 is provided over upper surface 42 of underlying insulating layer 40, defining an uppermost surface 46. Combination layer 44 is preferably different in composition from the insulating material of underlying layer 40. Where insulating layer 40 comprises an oxide, the material of region 44 preferably comprises an insulative nitride, such as $Si_3N_4$. Alternatively where region 40 comprises PSG or BPSG, the material of layer 44 might constitute $SiO_2$ deposited by decomposition of tetraethylorthosilicate (TEOS). The function of layer 44 will be apparent from the continuing discussion. Alternately considered, the combination of underlying layer 40 and combination layer 44 can be considered as a base layer 48 of insulating material, with layer 44 constituting an uppermost region 44 thereof.

In the illustrated and preferred embodiment, insulating base layer 48 is not homogeneous, with uppermost region 44 thereof being formed of a different material from remaining portions of base layer 48. Base layer 48 might also be formed to be homogeneous throughout, with the uppermost portion thereof providing the etch stop/oxidation barrier function, as will be apparent from the continuing discussion.

The thickness of uppermost region 44 is preferably from about 100 Angstroms to about 4000 Angstroms, depending upon the material used to provide a desired etch stop/ oxidation barrier function. Where uppermost region/layer 44 comprises $Si_3N_4$, the preferred thickness is from about 100 Angstroms to about 500 Angstroms. Where region 44 is provided by decomposition of tetraethylorthosilicate with remaining portions at the base layer comprising $SiO_2$ of another form, the preferred thickness is from about 500 Angstroms to about 4000 Angstroms.

An intermediate layer 49 of insulating material is provided atop uppermost region/layer 44 of base layer 48. The insulating material of intermediate layer 49 is different in composition from the insulating material of uppermost region/layer 44, with the insulating material of intermediate layer 49 being selectively etchable relative to the insulating material of uppermost region/layer 44. Typically and preferably, the insulating material of intermediate layer 49 will be the same as underlying insulating layer 40 (where base layer 48 is not homogeneous), and thus typically preferably comprises an oxide such as PSG or BPSG. For purposes of the continuing discussion, intermediate layer 49 has an upper surface 50.

Figure 2:
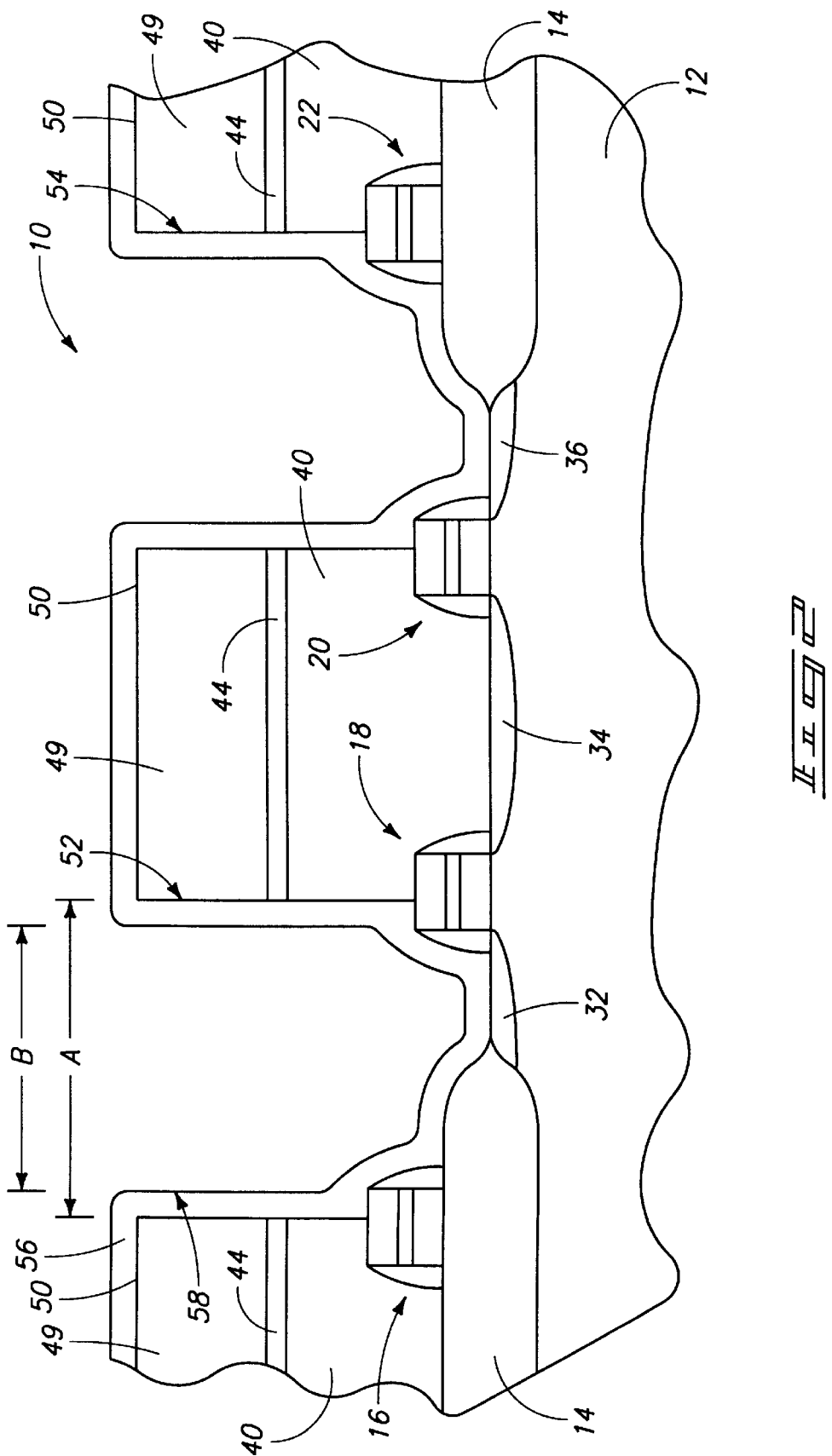
FIG. 2 is a sectional view of the FIG. 1 wafer at a processing step subsequent to that shown by FIG. 1.

Referring to FIG. 2, capacitor or first contact/container openings 52, 54 are etched through intermediate layer 49, combination layer 44 and underlying insulating layer 402 areas one source/drain areas 32, 36, thus outwardly exposing areas to which electrical connection is to be made. Contact/ container openings 52, 54 have a first open width "A" at upper surface 50. The discussion proceeds solely with reference to the capacitor being formed in contact/container opening 52, with an understanding that the same capacitor construction will be formed relative to contact/container opening 54. An example etch chemistry for producing the desired anisotropic contact/container etch would include $CHF_3$ and $O_2$ chemistry at low $O_2$ flow rates, or $CF_4$, Ar, $CH_2F_2$ and $CHF_3$ chemistry, for the oxide selective to the nitride of layer 44. This would be followed by a chemistry of $CHF_3$ and $O_2$ with increased $O_2$ flow rates for the etch of the nitride. This would be followed again by the low $O_2$ flow rate chemistry for the etch of the oxide to expose active areas 32, 36.

A first layer 56 of conductive material is provided above etched intermediate layer 49 and within first contact/ container opening 52 over source/drain area 32. Such will be utilized for formation of a conductive storage node. First layer 56 is provided to a thickness which is less than one-half first open width dimension "A" leaving a second outward opening 58 having a second open width "B", which is less than first open width "A". The conductive material of layer 56 is selected such that the insulating material of intermediate layer 49 is selectively etchable relative to the conductive material of first layer 56. Where intermediate layer 49 comprises oxide, an example suitable and preferred material for layer 56 is conductively doped hemispherical grain polysilicon.

Figure 3:
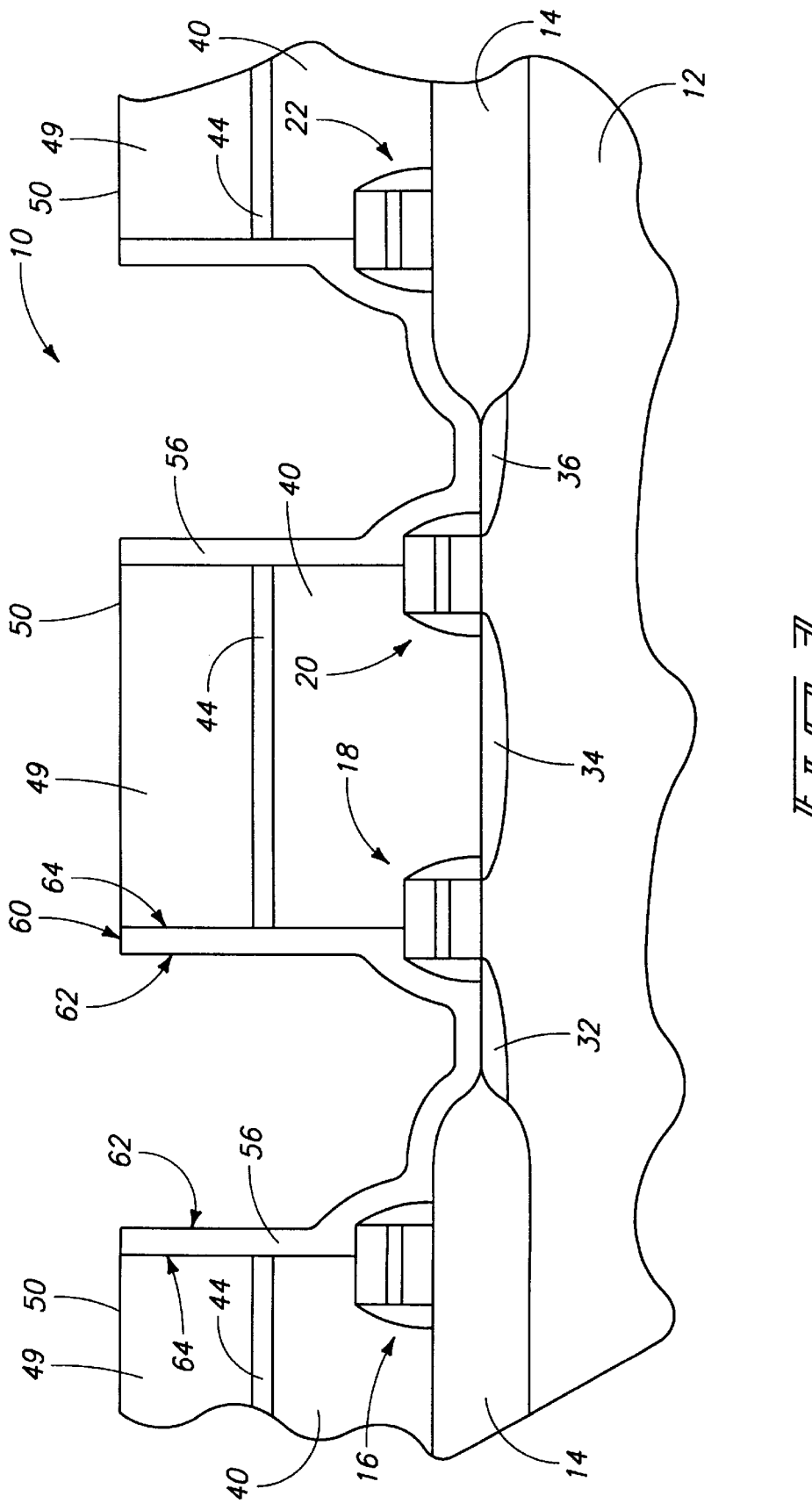
FIG. 3 is a sectional view of the FIG. 1 wafer at a processing step subsequent to that shown by FIG. 2.

Referring to FIG. 3, first layer of conductive material 56 is removed from above upper surface 50 of intermediate insulating layer 49 to define an isolated capacitor storage node container 60. The preferred technique for removing such material is by chemical-mechanical polishing (CMP) using, for example, a KOH, $SiO_2$ particles and water as a slurry. For purposes of the continuing discussion, isolated capacitor storage node 60 defines sidewalls, having inner surfaces 62 and outer surfaces 64.

Figure 4:
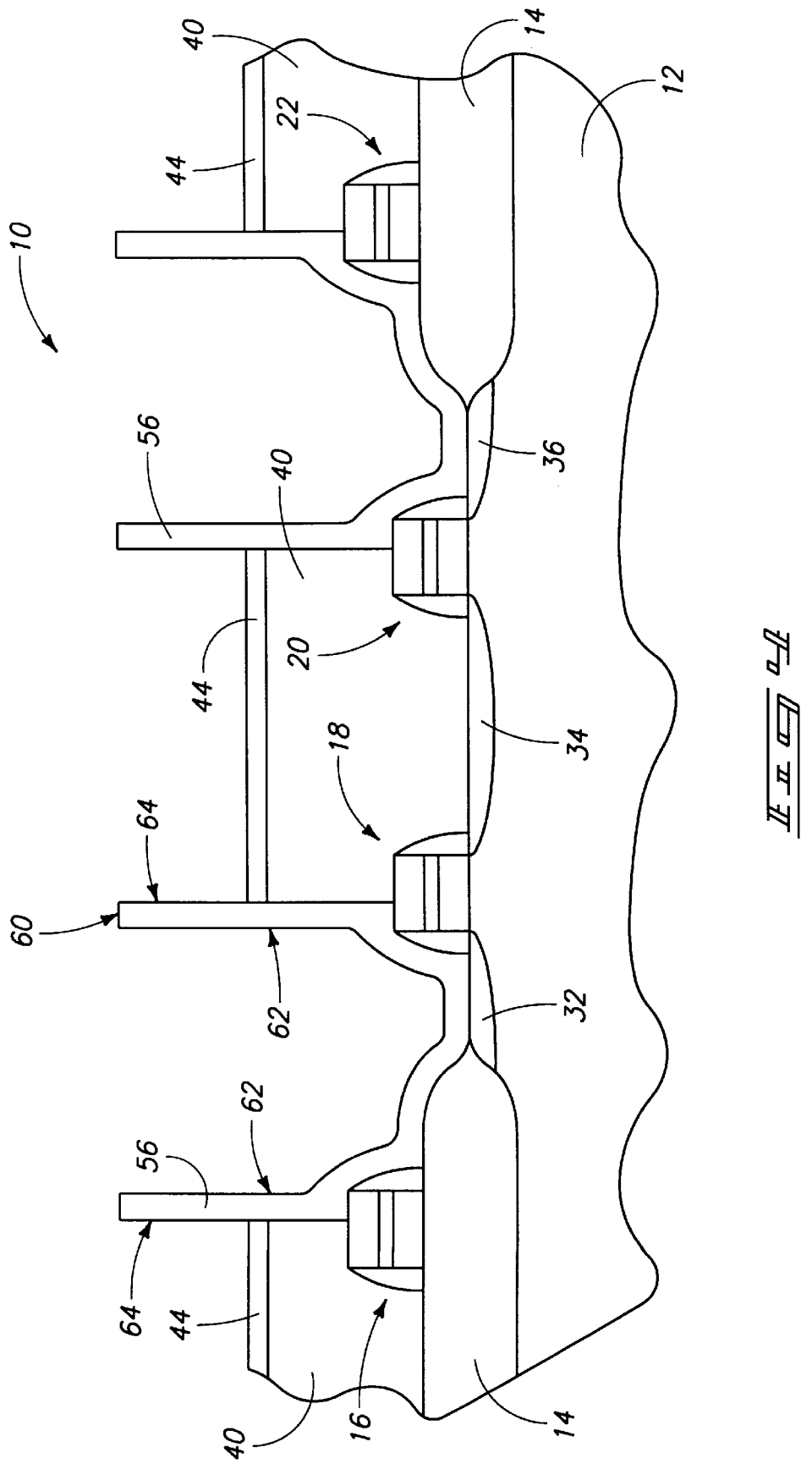
FIG. 4 is a sectional view of the FIG. 1 wafer at a processing step subsequent to that shown by FIG. 3.

Referring to FIG. 4, intermediate insulating layer 49 has been etched selectively relative to isolated capacitor storage node 60 and combination layer/uppermost region 44, using combination layer 44 as an etch stop during such etching to expose only a portion of outer surfaces 64 of the sidewalls of container 60. Prior techniques, such as disclosed in our co-pending U.S. patent application Ser. No. 07/947,523, principally employed a timed etch for exposing a portion of outer sidewalls of a capacitor container. Such provides a disadvantage of less process control in not being able to accurately set or predict the quantity of outside sidewall surface area which will be exposed, and thus resulting capacitance. The above-described combination layer/ uppermost region 44 thus provides a function of providing a defined end point for accurately controlling the quantity of outside surface area of the container to be exposed.

Figure 5:
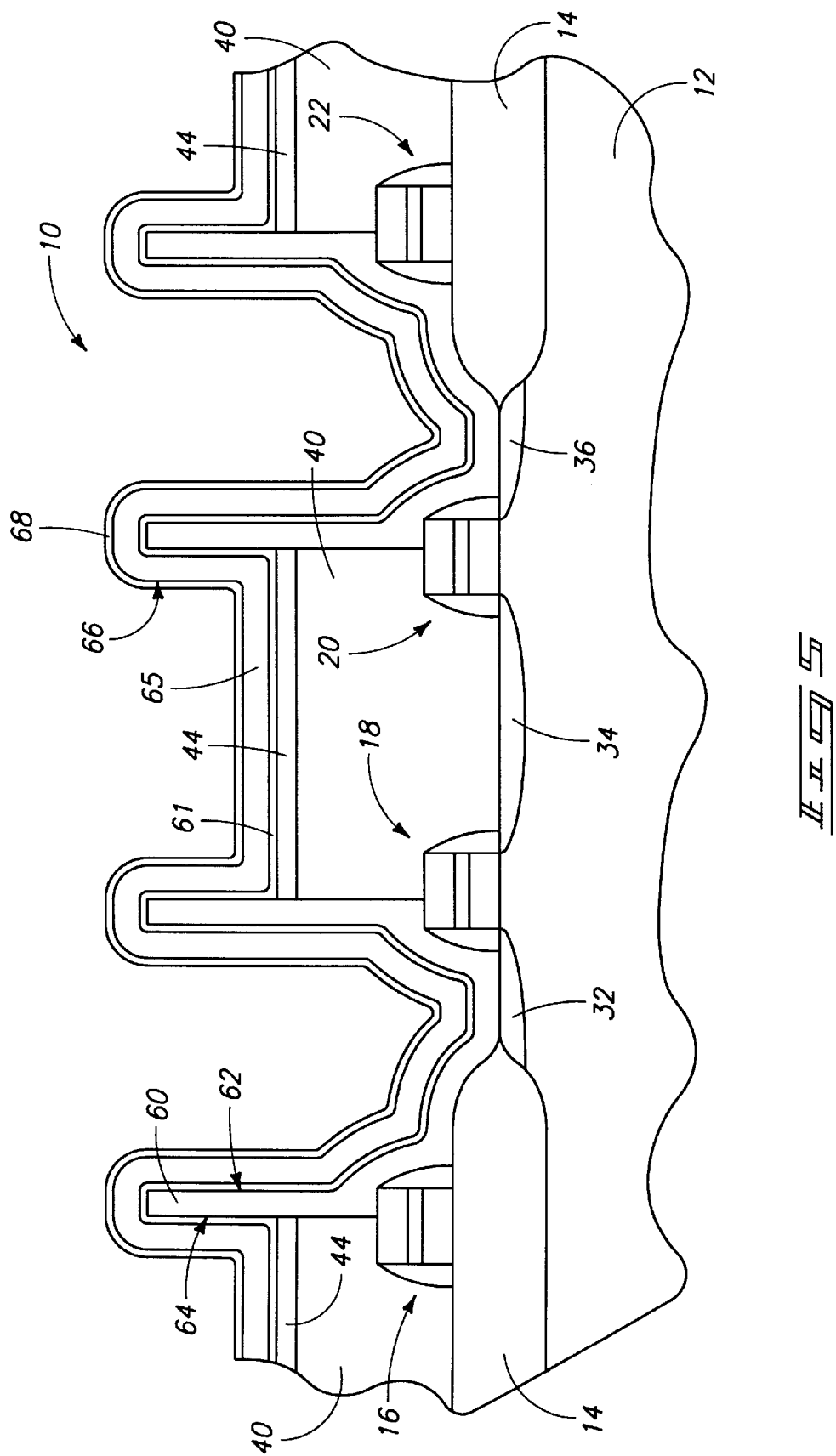
FIG. 5 is a sectional view of the FIG. 1 wafer at a processing step subsequent to that shown by FIG. 4.

Referring to FIG. 5, a capacitor dielectric layer 61 is provided atop the wafer over isolated capacitor storage node 60, including the inner and outer sidewall surfaces 62, 64 respectively, thereof. An example dielectric material would include an insulative nitride or oxide. Thereafter, a conductive capacitor cell layer 65 is provided over dielectric layer 61. A typical and preferred conductive material is conductively doped polysilicon. For purposes of the continuing discussion, cell capacitor layer 65 has an outer surface 66. An electrically insulative nitride oxidation barrier layer 68 is provided over cell polysilicon layer 65 to a thickness of at least about 150 Angstroms. A typical and preferred thickness for layer 68 is from about 250 Angstroms to about 1500 Angstroms. A typical and preferred material is $Si_3N_4$. The function of such layer will be apparent from the continuing discussion.

Figure 6:
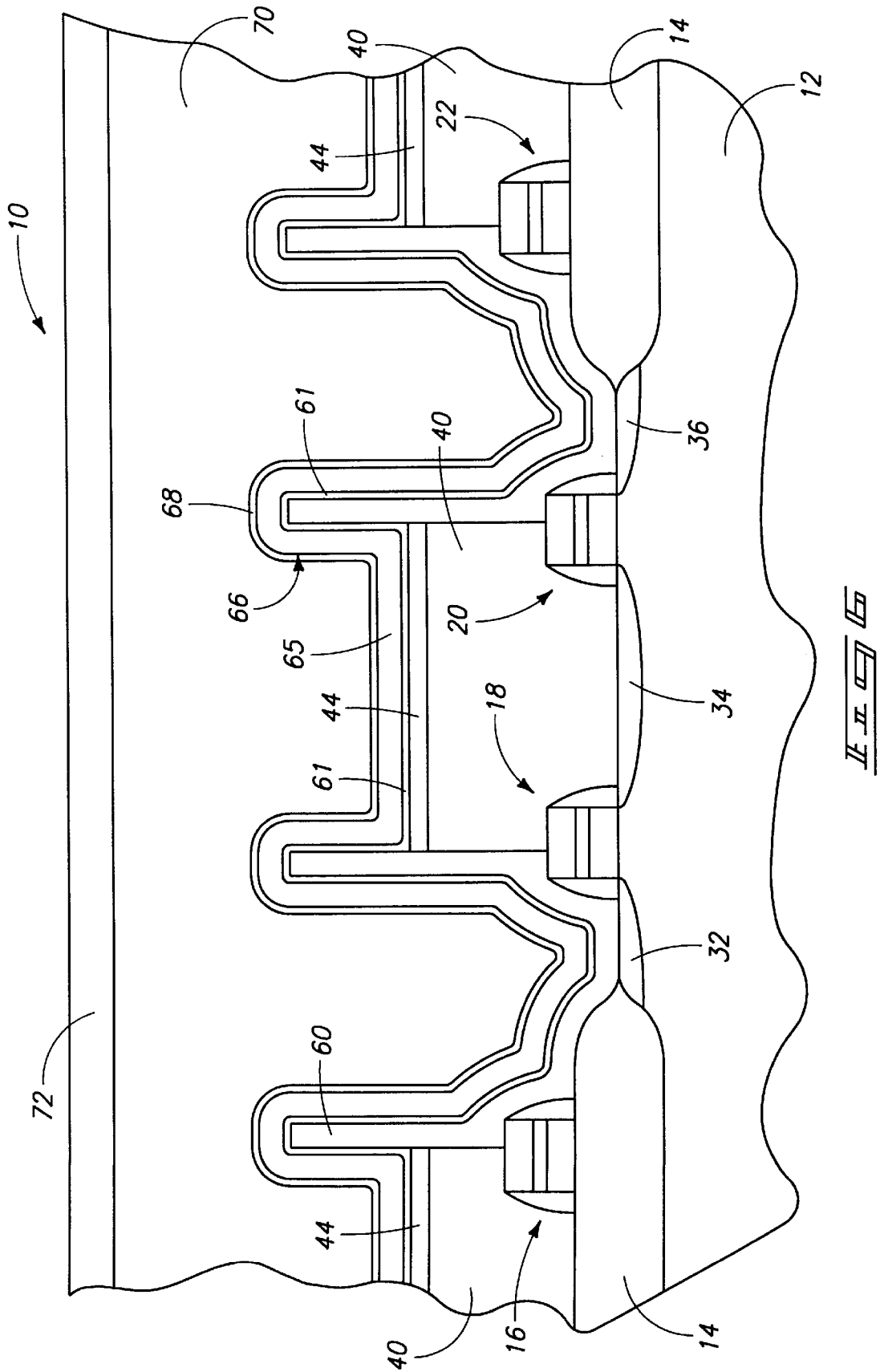
FIG. 6 is a sectional view of the FIG. 1 wafer at a processing step subsequent to that shown by FIG. 5.

Referring to FIG. 6, a planarized overlying layer 70 of insulating material is provided above nitride oxidation barrier layer 68. Such insulating material preferably comprises the same insulating material of underlying layer 40, and thus typically comprises an oxide such as PSG or BPSG. A masking layer 72 is provided above overlying layer 70. The material of the masking layer is selected such that material of overlying layer 70 and underlying 40 is selectively etchable relative to the material of masking layer 72. Where the materials of layers 70 and 40 comprise oxide, the material of masking layer 72 preferably comprises a nitride, such as $Si_3N_4$. In such case and where the material of uppermost region/layer 44 also comprises a nitride, the thickness of masking layer 72 is preferably provided to be greater than that of layer/region 44. The purposes of such will be apparent from the continuing discussion.

Figure 7:
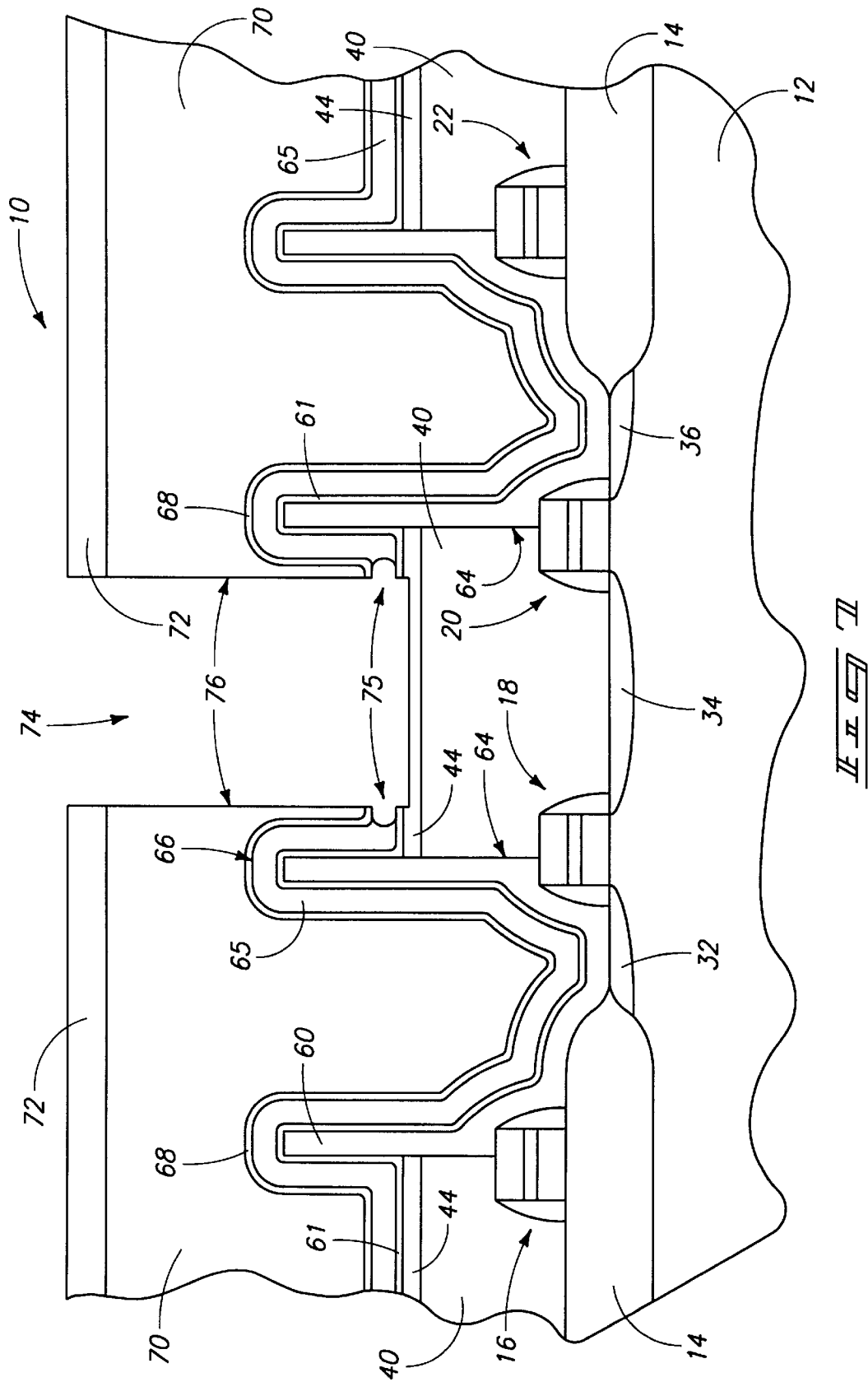
FIG. 7 is a sectional view of the FIG. 1 wafer at a processing step subsequent to that shown by FIG. 6.
Figure 8:
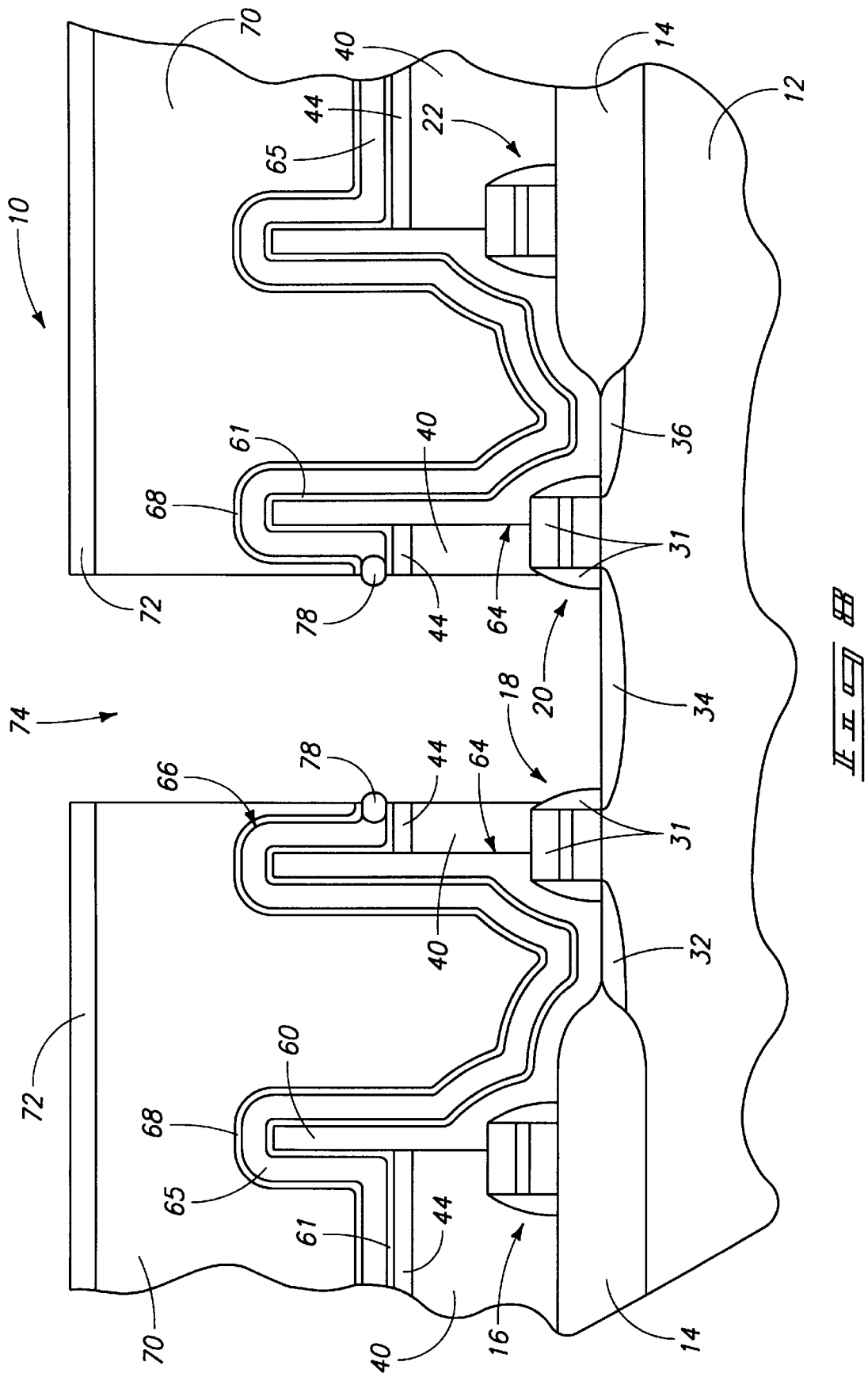
FIG. 8 is a sectional view of the FIG. 1 wafer at a processing step subsequent to that shown by FIG. 7.

Referring to FIG. 7, a bit line contact/container opening 74 is anisotropically etched over the other source/drain area 34 through masking layer 72, overlying layer 70, nitride oxidation barrier layer 68 and cell polysilicon layer 65. During such etch, combination layer/region 44 is utilized as an etch stop, which capacitor dielectric layer 61 being too thin to function as a reliable etch stop. For purposes of the continuing discussion, contact/container opening 74 includes interior sidewalls 76 which include a pair of exposed edges 75 of cell polysilicon layer 65. At the latter stages during such anisotropic etch, conditions are modified slightly to obtain an undercut etch into polysilicon exposed edges 75. Wafer 10 is then exposed to oxidizing ambient conditions to oxidize the cell polysilicon exposed edges to form insulating SiO$_2$ regions 78 (FIG. 8). Example oxidizing ambient conditions to produce the desired regions 78 would include H$_2$ and O$_2$ at 850° C. in a conventional atmospheric furnace. The reason for undercut into cell polysilicon layer 65 is to prevent regions 78 from undesirably projecting considerably into contact/container opening 74.

Exposure of a wafer to oxidizing ambient conditions typically causes oxidation of silicon, even that silicon which underlies such insulating layers as PSG and BPSG. In accordance with the invention, nitride oxidation barrier layer 68 during exposure to an oxidizing ambient inhibits oxidation of outer surface 66 of cell polysilicon layer 65 which would otherwise could occur through material of overlying layer 70. Additionally, combination layer/uppermost region 44 during oxidizing ambient exposure inhibits oxidation of lower outer sidewalls 64 of isolated capacitor storage node 60, and inhibits oxidation which would otherwise occur at the surface of silicon source/drain area 34.

Referring to FIG. 8, combination layer/uppermost region 44 is etched from within bit line contact/container opening 74. Note that during such etch, a like quantity of masking layer 72 is also removed. Accordingly where the materials of layers 72 and region 44 are the same, layer 72 is provided thicker than layer 44 such that an effective layer of masking material remains after the layer 44 etch. Then, underlying layer 40 is etched from within bit line contact/container opening 74 to outwardly expose source/drain area 34. During such etch, masking layer 72 prevents etch of material 70, thus eliminating any need for masking at this point. Note also that where regions 31 comprise an insulative nitride, such as Si$_3$N$_4$, an etch can be conducted which is selective to nitride and silicon of region 34. An example etch chemistry for such an anisotropic etch includes CHF$_3$ and CF$_4$. Alternately, a thin etch stop layer (such as Si$_3$N$_4$) could be deposited over the wafer and regions 31 prior to deposition of layer 40 to shield regions 31 from the final bit line contact/container etch.

Figure 9:
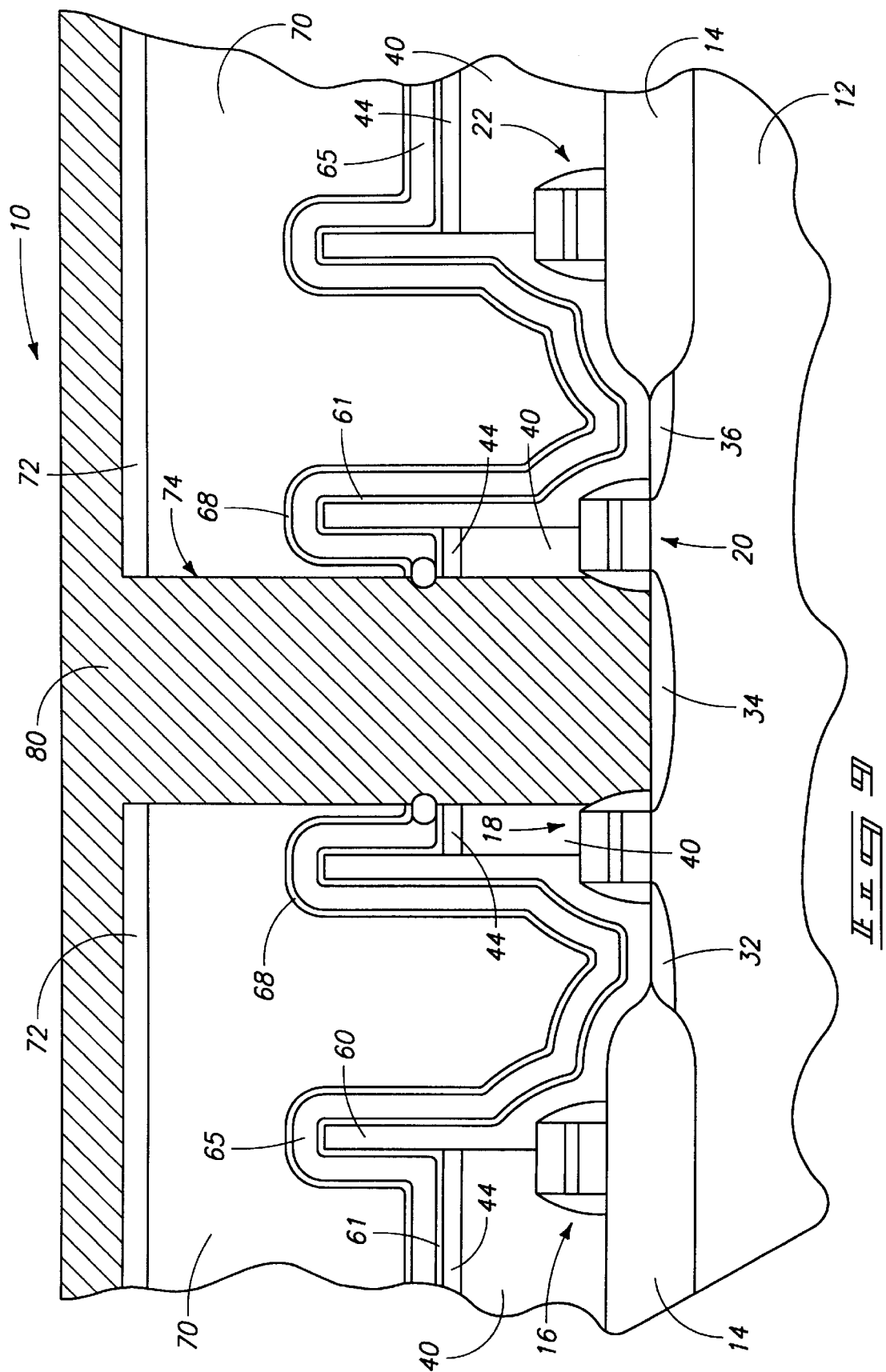
FIG. 9 is a sectional view of the FIG. 1 wafer at a processing step subsequent to that shown by FIG. 8.

Referring to FIG. 9, a conductive material 80, such as a metal or polysilicon, is deposited atop the wafer and within bit line contact/container opening 74 over exposed source/drain area 34. Such material or layer 80 can be patterned as desired to form a bit line, or etched back to form conductive bit contact plugs.

Other aspects of the invention are now described with reference to FIGS. 10–16. Referring first to FIG. 10, a semiconductor wafer fragment is indicated generally by reference numeral 90. Such comprises a bulk substrate 92 having field oxide 94 and word lines 96 and 98. An active or source/drain area 100 defines an area within substrate 92 to which electrical connection will be made for formation of a stacked container capacitor. An insulating layer 102 having an upper surface 104 is provided as shown. Therewithin is an etch stop layer 101, preferably comprised of nitride. A first contact/container opening 106 is etched through insulating layer 102 to outwardly expose area 100. First contact/container opening 106 has a first open width "A" at upper surface 104.

A first layer 108 of conductive material is provided above insulating layer 102 and within first contact/container opening 106 over area 100 to which electrical connection is to be made. Layer 108 has sidewalls 112. First layer 108 is provided to a thickness which is less than one-half first open width "A", leaving a second outward opening 110 having a second open width "B" between conductive material inner sidewalls 112. Width "B" is less than first open width "A".

Referring to FIG. 11, a layer 114 of sacrificial material is provided atop first layer 108 and within second outward opening 110. A preferred sacrificial material is an oxide, such as PSG or BPSG, deposited to a thickness of about 1000 Angstroms. Layer 114 is deposited to a thickness which is less than one-half second open width "B", leaving a third outward opening 116 having a third open width "C", which is less than second open width "B".

Figure 12:
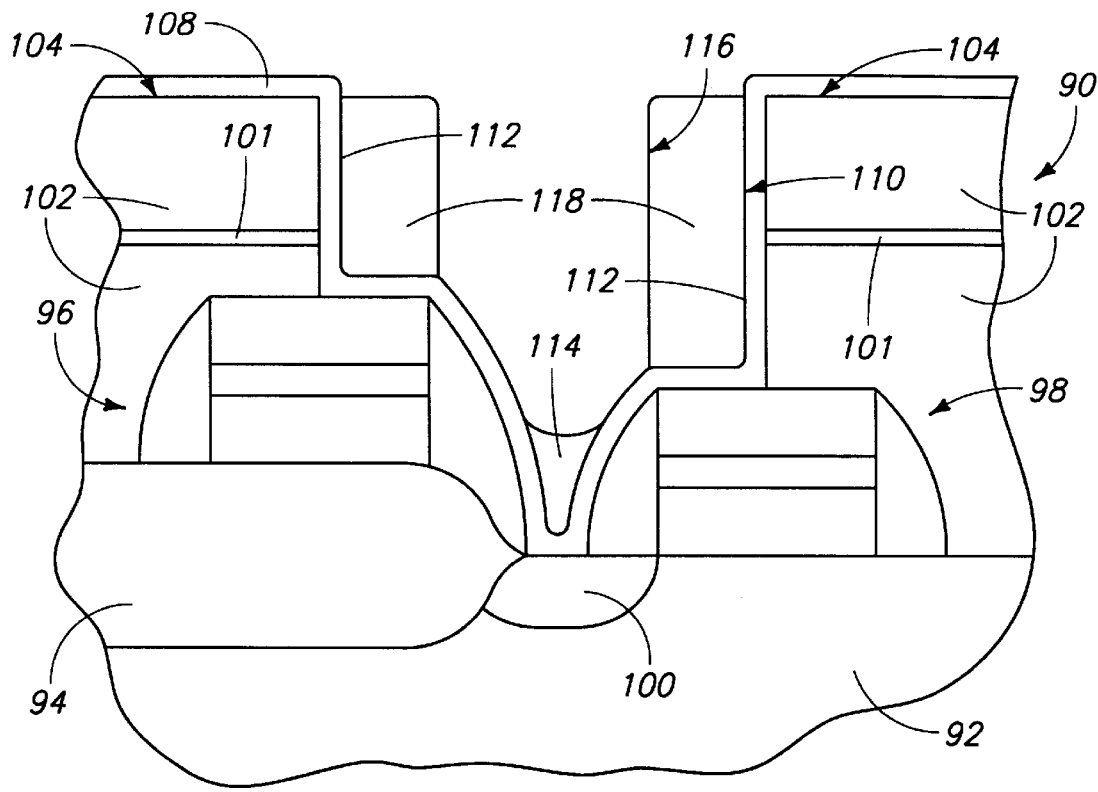
FIG. 12 is a sectional view of the FIG. 10 wafer at a processing step subsequent to that shown by FIG. 11.
Figure 12A:
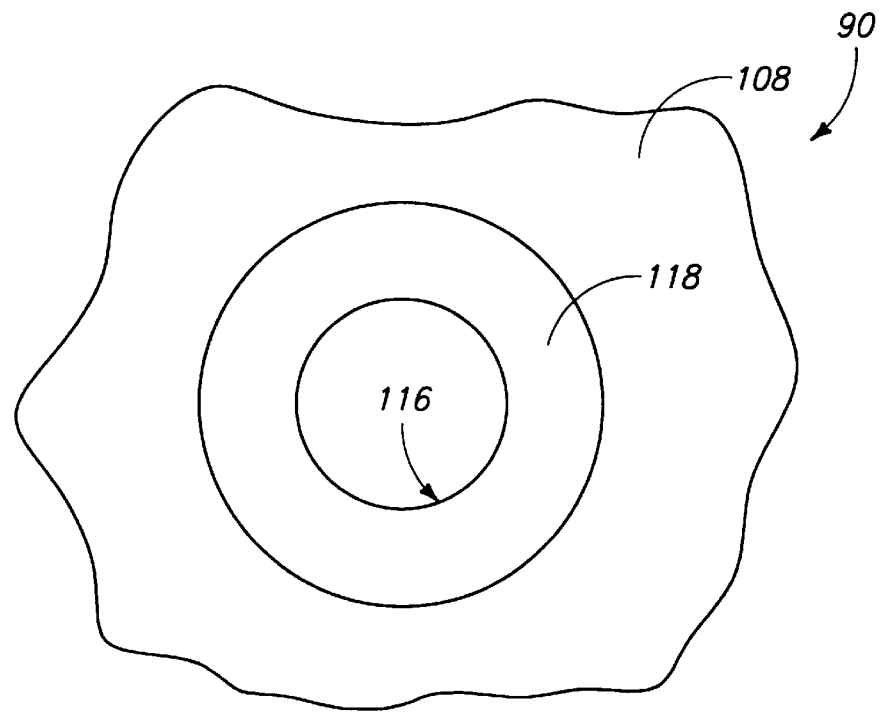
FIG. 12A is a top view of the FIG. 12.

Referring to FIGS. 12 and 12A, sacrificial layer 114 is anisotropically etched to define an isolated ring 118 of sacrificial material lining inner sidewalls 112 of conductive material layer 108 within second outward opening 110. Example conditions for conducting such etch selectively relative to polysilicon where the sacrificial layer is oxide includes using CF$_4$ and CHF$_3$ chemistry. Note also that some material 114 would typically remain in the lower groove previously formed, as shown. Such material could be removed, or remain in place. In the above described manner, sacrificial spacers in the form of a ring 118 are provided within second outward opening 110.

Figure 13:
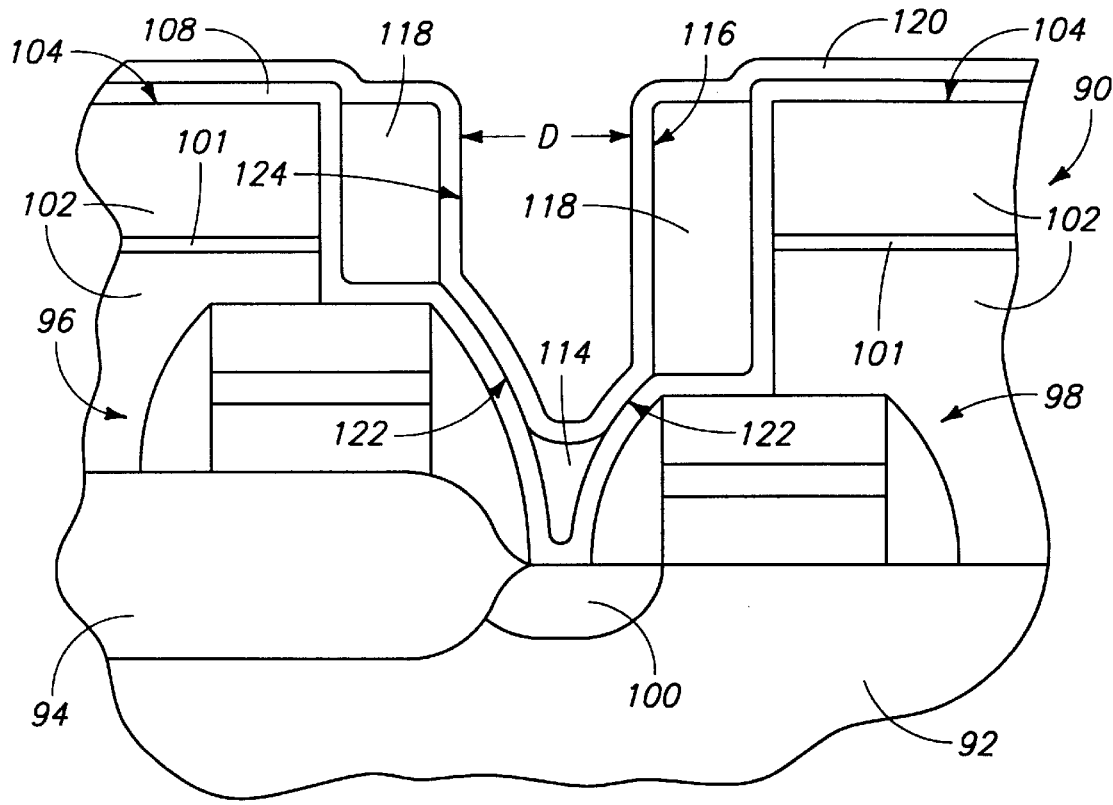
FIG. 13 is a sectional view of the FIG. 10 wafer at a processing step subsequent to that shown by FIG. 12.

Referring to FIG. 13, a second layer 120 of conductive material is provided above first conductive layer 108, and within third outward opening 116 and over sacrificial spacers/ring 118. Second layer 120 electrically connects with first layer 108 as shown at 122. Preferably and as shown, second layer 120 is provided within third outward opening 116 to a thickness which is less than one-half third open width "C", leaving a fourth outward opening 124 having a fourth width "D", which is less than third width "C". Such will facilitate the formation of a multiple container construction, as will be apparent from the continuing discussion. Preferably, the material of layer 120 is again conductively doped polysilicon.

Figure 14:
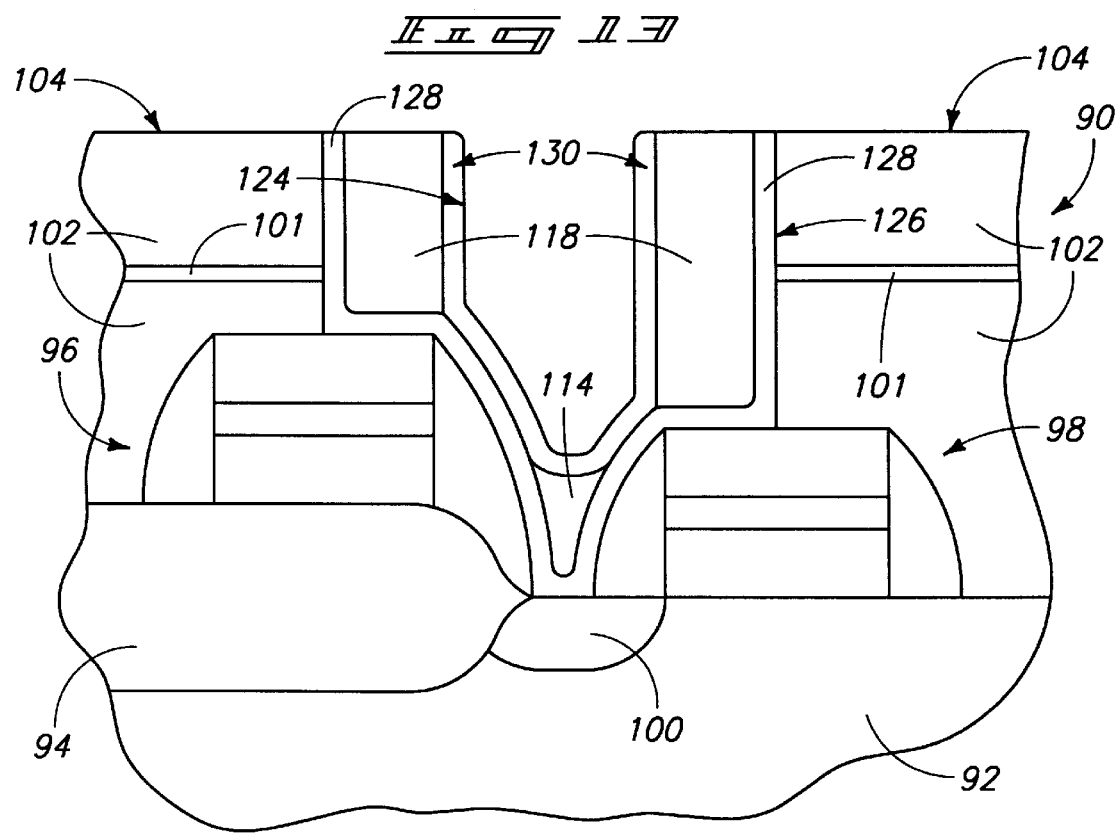
FIG. 14 is a sectional view of the FIG. 10 wafer at a processing step subsequent to that shown by FIG. 13.

Referring to FIG. 14, second conductive layer 120 and first conductive layer 108 are chemical-mechanical polished to insulating layer 102 upper surface 104 in a single CMP step, to thereby define an electrically isolated capacitor storage node 126. Storage node 126 has sidewalls 128 which electrically interconnect with an inner upwardly projecting conductive mass 130. As illustrated in the preferred embodiment, upwardly projecting conductive mass 130 is in the shape of a second ring concentrically positioned within first ring 128, thus forming a multiple container-like capacitor storage node (FIG. 15A). Example CMP conditions for removing polysilicon with a high degree of selectively relative to oxide of insulating layer 102 and ring 118 would include using a KOH, SiO$_2$ and water slurry.

Figure 15:
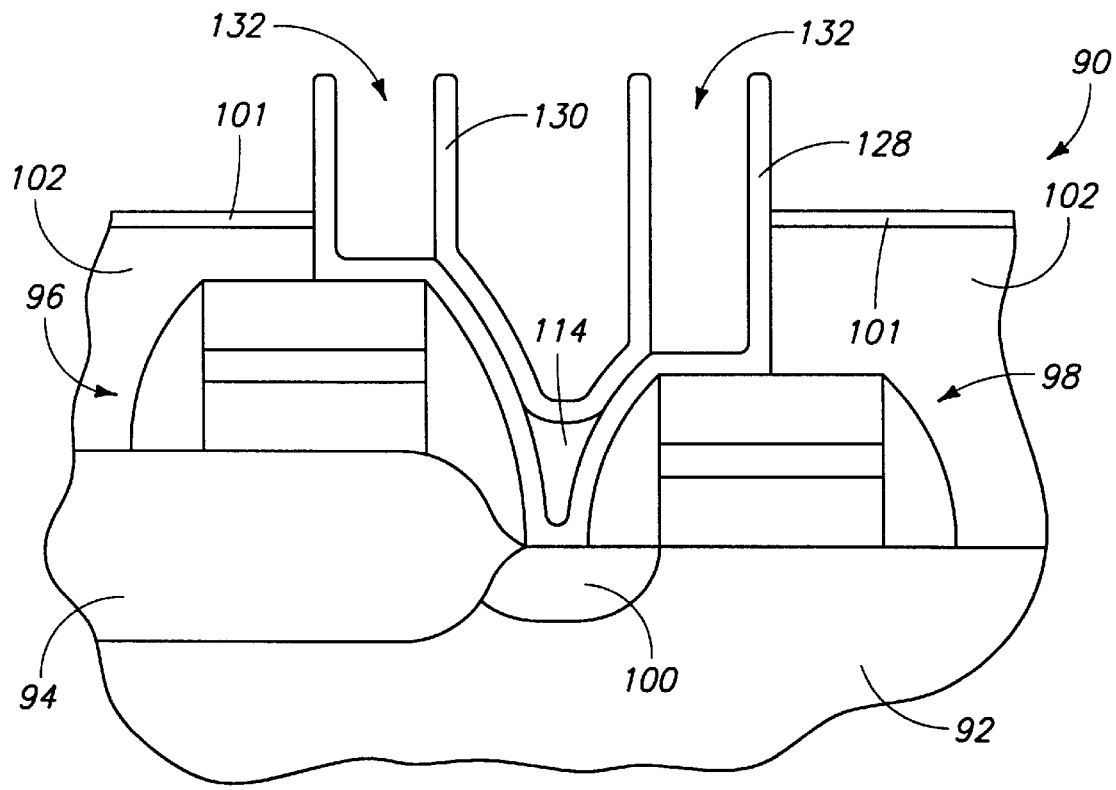
FIG. 15 is a sectional view of the FIG. 10 wafer at a processing step subsequent to that shown by FIG. 14.
Figure 15A:
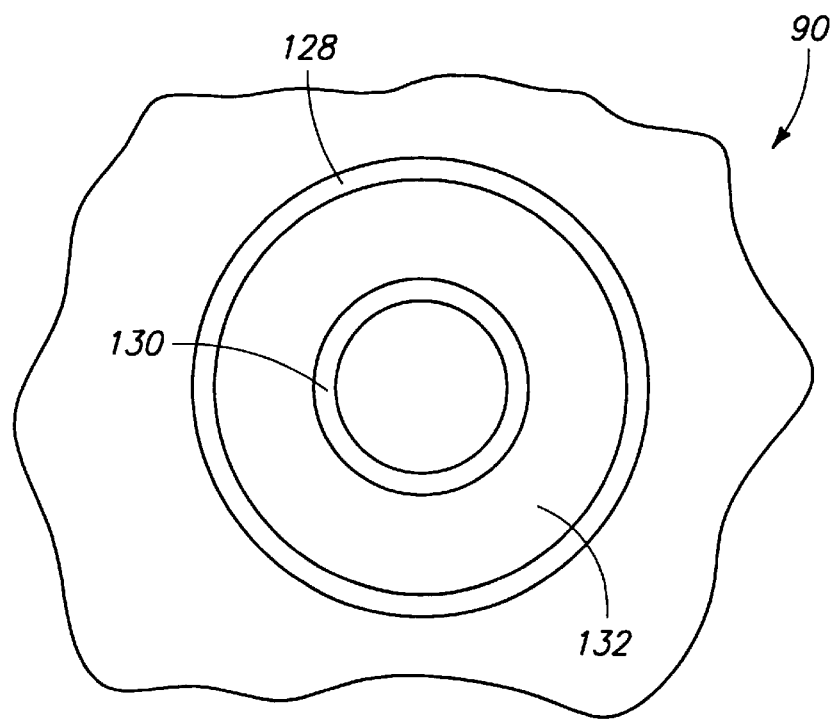
FIG. 15A is a top view of FIG. 15.

Referring to FIGS. 15 and 15A, sacrificial spacers/ring 118 is etched away from the wafer to provide lateral space 132 between upwardly projecting conductive mass 130 and container sidewalls 128. Example etch conditions would include a wet dilute HF etch. Where the material of layer 102 is the same or similar as the sacrificial material regarding etching, layer 101 provides an etch stop function, and advantageously results in exposure of the outer sidewalls of container 128.

Referring to FIG. 16, a capacitor dielectric layer 134 is provided over the FIG. 15 construction. Thereafter, a conductive capacitor cell layer 136, such as conductive polysilicon, is provided over capacitor dielectric layer 134.

It will be appreciated by the artisan that the inventive techniques of FIGS. 10–16 could be employed in forming the capacitor construction shown in the FIGS. 1–9 embodiment. In conjunction therewith, the above recited step of "removing the first layer conductive material from above the intermediate insulating layer to define an isolated capacitor storage node container . . ." would include the above-recited steps of providing sacrificial spacers, second layer of conductive material and chemical-mechanical polishing steps.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a DRAM storage device over a substrate comprising:
   forming a storage capacitor over a substrate node location laterally adjacent a substrate area in which a bit line contact is to be formed, the substrate node location being received between a pair of conductive word lines, the storage capacitor having a cell plate layer having an exposed edge adjacent the substrate area in which the bit line contact is to be formed;
   forming an oxidation barrier insulative layer over the cell plate layer, the oxidation barrier insulative layer having an outermost surface which is everywhere planar between the pair of conductive word lines;
   removing cell plate layer exposed edge material to a degree sufficient to undercut the cell plate layer relative to material of the oxidation barrier insulative layer;
   oxidizing the undercut cell plate layer, the oxidation barrier insulative layer serving to protect adjacent cell plate layer material during the oxidizing;
   after the oxidizing, outwardly exposing the substrate and defining the area in which the bit line contact is to be formed; and
   forming conductive material over the substrate and within the area defined by the exposing, the oxidized undercut cell plate layer being electrically insulated from the conductive material.

2. A method of forming a bit line contact in a DRAM storage device comprising:
   interposing an etch stop layer between insulative materials over a substrate node location with which electrical communication is desired, the substrate node location being received between a pair of conductive word lines, the etch stop layer having an outermost surface which is everywhere planar between the pair of conductive word lines;
   etching a first of the insulative materials to expose the etch stop layer and responsive thereto, terminating the etching;
   after the etching of the first of the insulative materials, etching at least portions of the planar etch stop layer between the conductive word lines and a second of the insulative materials to expose the substrate node location; and
   forming conductive material over and in electrical communication with the exposed node location, the conductive material comprising a bit line contact.

3. The method of claim 2, wherein the insulative materials are of the same material type.

4. The method of claim 2 further comprising after etching the first insulative material and prior to etching the second insulative material, oxidizing only a portion of a cell plate layer.

5. The method of claim 2 wherein the etch stop layer is supported by the second insulative material.

6. The method of claim 2 further comprising:
   after etching the first insulative material and prior to etching the second insulative material, oxidizing only a portion of a cell plate layer; and
   wherein the etch stop layer is supported elevationally outwardly of the conductive line by the second insulative material.

7. A method of forming a DRAM storage device comprising:
   forming a storage capacitor relative to a semiconductive substrate, the storage capacitor having a capacitor cell layer which extends over:
      a node location with which electrical communication is desired, the node location being defined between a pair of laterally spaced apart conductive lines, one of the conduct lines comprising an access transistor for the storage capacitor;
      an etch stop layer which is disposed over the node location and some of at least one of the conductive lines, and which has an outermost surface which is everywhere planar between the pair of lines, and
      insulative material which is disposed under the etch stop layer, at least some of the insulative material being disposed laterally adjacent and between the conductive lines;
   etching capacitor cell layer portions over the node location to a degree sufficient to expose the etch stop layer;
   removing portions of the etch stop layer and the insulative material thereunder and between the conductive lines to expose the node location; and
   forming conductive material over the node location and in electrical communication therewith.

8. The method of claim 7, wherein the etch stop layer is disposed over both of the conductive lines.

9. The method of claim 7, wherein the etch stop layer has an outermost surface the entirety of which is disposed elevationally outwardly of the conductive line pair.

10. The method of claim 7, wherein the etching of the capacitor cell layer portions comprises anisotropically etching said portions.

11. The method of claim 7, wherein the etching of the capacitor cell layer portions comprises undercutting material of the capacitor cell layer relative to the etch stop layer and a capacitor dielectric layer.

12. A semiconductor processing method of forming a stacked capacitor on a semiconductor wafer, the method comprising the following steps:
   providing a first node for electrical connection with a capacitor plate;
   providing a second node;
   forming an underlying layer of insulating material atop the wafer;
   forming a combination etch stop and oxidation barrier insulative layer over the underlying insulating layer, the combination layer being different in composition from the insulating material of the underlying layer;
   forming an intermediate layer of insulating material over the combination layer, the insulating material of the intermediate layer being different in composition from the insulating material of the combination layer with the insulating material of the intermediate layer being selectively etchable relative to the insulating material of the combination layer;
   etching a capacitor contact opening through the intermediate, combination and underlying insulating layers to the first node;

forming a capacitor storage node within the capacitor contact opening in electrical communication with the first node, the storage node having outer sidewall surfaces;

etching the intermediate insulating layer selectively relative to the capacitor storage node and combination layer, and using the combination layer as an etch stop during such etching to expose only a portion of the outer surfaces of the capacitor storage node sidewalls;

forming a capacitor dielectric layer over the outer sidewall surfaces of the capacitor storage node;

forming a cell electrically conductive oxidizable material layer over the capacitor dielectric layer, the cell layer having an outer surface;

forming an electrically insulative oxidation barrier layer over the cell layer;

forming an overlying layer of insulating material above the oxidation barrier layer;

forming a masking layer of the same material as the combination layer above the overlying layer, the masking layer being provided to a thickness which is greater than that of the combination layer;

etching a first opening over the second node through the overlying, oxidation barrier and cell layers using the combination layer as an etch stop during such first opening etching, the first opening having sidewalls, the first opening sidewalls including an exposed edge of the cell layer;

oxidizing the cell layer exposed edge, the oxidation barrier layer during such oxidation exposure inhibiting oxidation of the outer surface of the cell layer, the combination layer during such oxidation exposure inhibiting oxidation of the capacitor storage node;

etching the combination layer from within the first opening;

etching the underlying layer from within the first opening to outwardly expose the second node for electrical contact; and forming electrically conductive material within the first opening.

* * * * *

UNITED STATES PATENT AND TRADEMARK OFFICE
CERTIFICATE OF CORRECTION

PATENT NO : 6,037,218
DATED : March 14, 2000
INVENTOR(S) : Charles H. Dennison et al.

It is certified that error appears in the above-identified patent and that said Letters Patent are hereby corrected as shown below:

Col. 5, line 33
  replace "402"
  with --40--.

Signed and Sealed this

Twenty-fourth Day of April, 2001

*Attest:*

NICHOLAS P. GODICI

*Attesting Officer*   Acting Director of the United States Patent and Trademark Office